United States Patent
Khayrallah et al.

(10) Patent No.: US 8,451,952 B2
(45) Date of Patent: May 28, 2013

(54) ITERATIVE DECODING AND DEMODULATION WITH FEEDBACK ATTENUATION

(75) Inventors: Ali S. Khayrallah, Cary, NC (US); Gregory E. Bottomley, Cary, NC (US); Jung-Fu Cheng, Fremont, CA (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 699 days.

(21) Appl. No.: 12/650,219

(22) Filed: Dec. 30, 2009

(65) Prior Publication Data

US 2011/0158359 A1 Jun. 30, 2011

(51) Int. Cl.
*H04L 27/06* (2006.01)
(52) U.S. Cl.
USPC .......................................................... 375/340
(58) Field of Classification Search
USPC ................. 375/340, 341; 714/786, 752, 755
See application file for complete search history.

(56) References Cited

U.S. PATENT DOCUMENTS

| | | | |
|---|---|---|---|
| 8,019,020 B1 * | 9/2011 | Chaichanavong et al. | .... 375/340 |
| 2006/0195765 A1 | 8/2006 | Coffey | |
| 2007/0283220 A1 * | 12/2007 | Kim | ................................ 714/758 |
| 2007/0297496 A1 * | 12/2007 | Park et al. | ...................... 375/148 |
| 2010/0169734 A1 * | 7/2010 | Gamage et al. | .............. 714/752 |

FOREIGN PATENT DOCUMENTS

| | | |
|---|---|---|
| EP | 1 094 612 A1 | 4/2001 |
| EP | 1 821 415 A1 | 8/2007 |
| WO | WO 2004/079563 A1 | 9/2004 |

OTHER PUBLICATIONS

Clevorn et al: "Turbo decodulation: iterative combined demodulation and source-channel decoding", IEEE Communications Letters, IEEE Service Center, Piscataway, NJ, US, vol. 9, No. 9, Sep. 1, 2005, pp. 820-822, XPOO1512695, ISSN: 1089-7798, 001: DOI:10.1109/LCOMM.2005.1506714.

Gracie et al: "Turbo and Turbo-Like Codes: Principles and Applications in Telecommunications", Proceedings Of The IEEE, IEEE. New York, US, vol. 95, No. 6, Jun. 1, 2007, pp. 1228-1254, XPOII189323, ISSN: 0018-9219, 001: DOI:10.1109/JPROC.2007.895197.

Lampe et al: "Convergence of iterative decoding without channel estimation", Proc, IEEE Internat. Symp. on Personal, Indoor and Mobile Radio Communications, PIMRC 2004, Barcelona, Spain, vol. 2, Sep. 5, 2004, pp. 774-779, XP010754136, 001: DOI:10.1109/PIMRC.2004.1373805 ISBN: 978-0-7803-8523-8.

* cited by examiner

*Primary Examiner* — Betsy Deppe (57) ABSTRACT

An iterative demodulator and decoder uses feedback attenuation to maintain proper balance between the demodulator and decoder. Balance is maintained by attenuating the influence of extrinsic information fed back from the decoder to the demodulator to prevent strong decisions by the decoder from overwhelming the demodulator.

52 Claims, 10 Drawing Sheets

ITERATIVE DECODING AND DEMODULATION WITH FEEDBACK ATTENUATION

BACKGROUND

The present invention relates to a method and apparatus for iterative decoding and demodulation of a received signal and, more particularly, to a method of iterative decoding and demodulation using feedback attenuation to maintain balance between the demodulator and decoder.

The basic function of a communication system is to send information over a communication channel from a source that generates the information to one or more destinations. In a digital communication system, the information is converted into a digital format and transmitted over the communication channel. The transmission of digital information is subject to the adverse effects of the communication channel, such as co-channel interference, noise, dispersion, and fading. These effects introduce errors into the transmitted data stream, which can be particularly severe in a wireless communication system.

In 1948, Claude E. Shannon demonstrated in a landmark paper that proper encoding of the digital information can reduce errors introduced by a noisy channel to any desired level. Encoding is the process of adding redundancy to the digital information prior to its transmission so that a decoder at the receiving end can detect and correct any errors that may occur during transmission. The decoder uses the redundant information added at the transmitter and knowledge of the coding scheme to correct the data transmission errors.

In a conventional communication system, CRC bits are added to an information sequence to be transmitted. The original information sequence with the CRC bits are then encoded using a forward error correction code, such as a convolutional code. The coded information bits are then interleaved to provide greater robustness against burst errors. Following interleaving, the coded bits are fed to a modulator. The modulator divides the coded bits into groups of L bits and maps the grouped bits to symbols of a modulation constellation. The size of the modulation is $2^L$.

At the receiver, the received symbol sequence is fed to a demodulator. The demodulator performs reverse mapping of the received symbols into bit soft values. The bit soft values are de-interleaved and fed to a decoder. Taking the decoder's perspective, the bit soft values output from the demodulator are referred to herein as input soft values (ISVs). The decoder uses its knowledge of the coding scheme to decode the input soft values and generate an estimate of the original information bit sequence. The decoder uses the CRC bits to verify the accuracy of its estimate.

Despite the redundancy introduced by error coding, the estimate of the information bit sequence output by the decoder may contain residual bit errors. The distortion of the received signal caused by the communication channel causes the demodulator to make errors. Bit errors in the input soft values output by the demodulator, in turn, may exceed the error correcting capability of the decoder and thus cause the decoder to make errors in the decoding process. One measure of the performance of the decoder is the block error rate (BLER).

It is known that iterative demodulation and decoding can reduce the block error rate of a decoder. In conventional systems, the demodulator generates soft information that is fed forward to the decoder. The decoder uses the soft information to generate an estimate of the received signal. The main idea behind iterative demodulation and decoding is to repeatedly demodulate and decode the received signal while feeding back soft information from the decoder to the demodulator. The soft information fed back from the decoder to the demodulator is often referred to as extrinsic information. The extrinsic information may take the form of a sequence of extrinsic values (EVs) that correspond to respective input soft values output by the demodulator. In the first iteration, the decoder makes the same errors as a standard receiver. However, in the second and subsequent iterations, the demodulator processes the extrinsic values along with the received signal to produce new input soft values for the decoder. The block error rate of the decoder can be reduced if the extrinsic information fed back from the decoder to the demodulator helps reduce errors in the input soft values output by the demodulator. In general, the block error rate decreases with the number of iterations because of the feedback of extrinsic information from the decoder to the demodulator.

Iterative demodulation and decoding works well as long as there is a balance between the demodulator and the decoder. However, an imbalance between the demodulator and decoder can prevent the correction of decoding errors. Such imbalance may occur, for example, when the decoder makes a strong decision that is reflected in the extrinsic information fed back to the demodulator, thus forcing the demodulator to agree with the result already determined by the decoder. This type of imbalance occurs most often when the decoder uses a code with strong error correcting capabilities, such as a low-rate code or a code with a large number of states. In this case, the decoder may provide strong feedback even when it is incorrect.

SUMMARY

The present invention relates to a method and apparatus for maintaining proper balance between the demodulator and decoder for iterative demodulation and decoding. Balance is maintained by attenuating the influence of extrinsic information fed back from the decoder to the demodulator to prevent strong decisions by the decoder from overwhelming the demodulator.

In one embodiment, an attenuator is placed in the feedback path from the decoder to the demodulator. The attenuator controls the strength and/or amount of the extrinsic information fed back to the demodulator. The attenuator can take the form of a regular effective puncturer, a non-regular effective puncturer, a variable gain linear limiter, a variable gain non-linear limiter, a variable gain multiplier, a limiter/multiplier with regular period, and a limiter/multiplier with a pseudo-random period.

In another exemplary embodiment, an attenuator is placed in the feed forward path from the demodulator to the decoder to alter the input soft values fed to the decoder. Controlling the input soft values to the decoder changes the confidence the decoder may have in its own result and, thus, indirectly attenuates the influence of the extrinsic information fed back to the demodulator. The attenuator in the feed forward path can take the same forms as the attenuator in the feedback path described above.

In yet another embodiment of the present invention, attenuators may be placed in both the feed forward and feed back paths.

DETAILED DESCRIPTION

Figure 1:
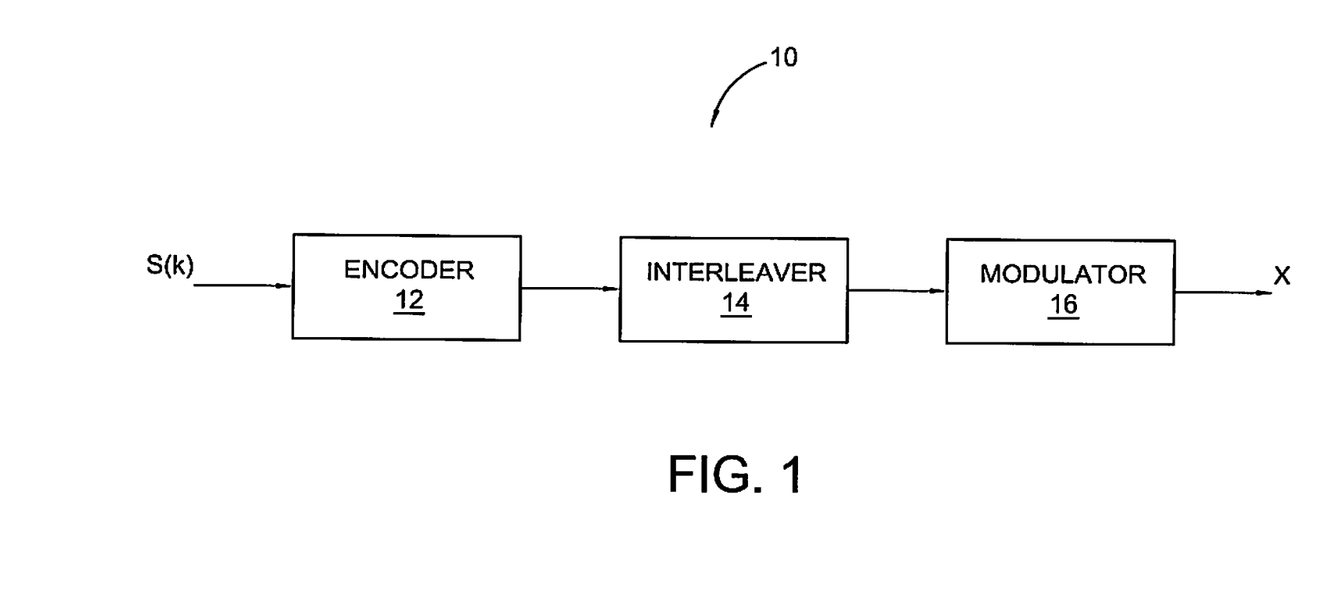
FIG. 1 illustrates an exemplary transmitter for coding and modulating an information sequence for transmission over a wireless communication channel.

Referring now to the drawings, FIG. 1 illustrates the main components of a transmitter 10 for coding and modulating an information sequence s(k) for transmission over a wireless communication channel. The transmitter 10 comprises an encoder 12, an interleaver 14, and a modulator 16. The encoder 12 adds cyclic redundancy check (CRC) bits to an information sequence to generate codeword comprising K bits. The encoder 12 then encodes the information bits along with the redundant bits to generate a coded information sequence comprising N bits, referred to herein as a code block. The rate of the encoder is K/N. In some embodiments, the encoder 12 uses a low rate mother code to generate a coded information sequence comprising M bits and punctures M−N bits to generate a code block having the desired code rate. The interleaver 14 reorders the bits of the code block. In some embodiments, the reordering may interleave bits from two or more code blocks. The coded bit sequence output from the interleaver 14 is fed to the modulator 16. The modulator 16 divides the coded bit sequence into groups of L bits and maps each group of L bits to corresponding symbols of a modulation constellation comprising $2^L$ symbols. The resulting modulation symbols x are then applied to a carrier and transmitted over the communication channel.

Figure 2:
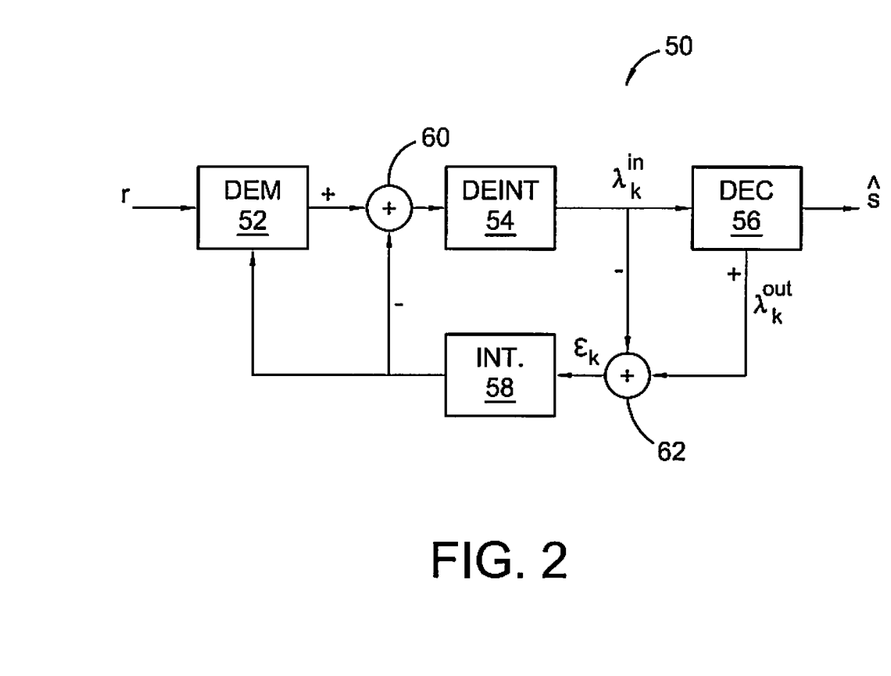
FIG. 2 illustrates an exemplary receiver for iteratively demodulating and decoding signals received over a wireless communication channel to recover a transmitted information sequence.

FIG. 2 illustrates an exemplary receiver 50 for demodulating and decoding the signal transmitted by the transmitter 10. The receiver 50 includes a demodulator 52, a de-interleaver 54, a decoder 56, and an interleaver 58. The received signal r at the receiver 50 is a distorted version of the signal x transmitted by the transmitter 10. The distortions of the received signal r may cause the demodulator 52 and decoder 56 to generate bit errors. In some instances, the number of bit errors may exceed the error correcting capability of the error correcting code and thus result in residual errors that are not corrected by the decoder. The receiver 50 according to one embodiment of the present invention uses an iterative demodulation and decoding process to reduce these residual bit errors.

The received signal r is fed to the demodulator 52, which performs reverse mapping of the received symbols to points on the modulation constellation, and outputs a sequence of N bit soft values $\lambda_k$ in log likelihood ratio (UR) format. The bit soft values $\lambda_k$ generated by the demodulator 52, which reflect any bit errors caused by the communication channel, are fed forward along a feed-forward path to the decoder 56. The job of the decoder 56 is to detect and correct the channel-induced bit errors. The bit soft values $\lambda_k$ are combined by adder 60 with extrinsic information $\epsilon_k$ fed back from the decoder 52 and re-ordered by de-interleaver 54. Taking the perspective of the decoder 56, the bit soft values fed into the decoder 56 are referred to herein as input soft values (ISVs) denoted as $\tilde{\lambda}_k^{in}$. The decoder 56 uses knowledge of the coding scheme to generate an estimate ŝ(k) of the original information sequence s(k) from $\tilde{\lambda}_k^{in}$. More particularly, the decoder 56 generates a sequence of N output soft values (OSVs) $\tilde{\lambda}_k^{out}$ and makes a hard decision to generate the information sequence estimate ŝ(k).

The output soft values $\tilde{\lambda}_k^{out}$ are fed back along a feedback path connecting an output of the decoder 56 with an input of the demodulator 52. Adder 62 in the feedback path subtracts the input soft values $\tilde{\lambda}_k^{in}$ fed into the decoder 56 from the output soft values $\tilde{\lambda}_k^{out}$ to generate a sequence of N extrinsic values $\epsilon_k$. The extrinsic values $\epsilon_k$ are re-ordered by interleaver 58 and fed back to the demodulator 52. For the initial iteration, each $\epsilon_k$ equals zero so that the bit soft values $\lambda_k$ output by the demodulator 52 are fed directly to the decoder 56 after de-interleaving. In the second iteration, the demodulator 52 exploits the extrinsic values $\epsilon_k$ and processes them with the received signal to produce a new set of input soft values $\tilde{\lambda}_k^{in}$ for the decoder 56. The new input soft values $\tilde{\lambda}_k^{in}$ are obtained by taking the bit soft values $\lambda_k$ output from the demodulator 52 and subtracting the extrinsic values $\epsilon_k$ fed into the demodulator 52.

Figure 3:
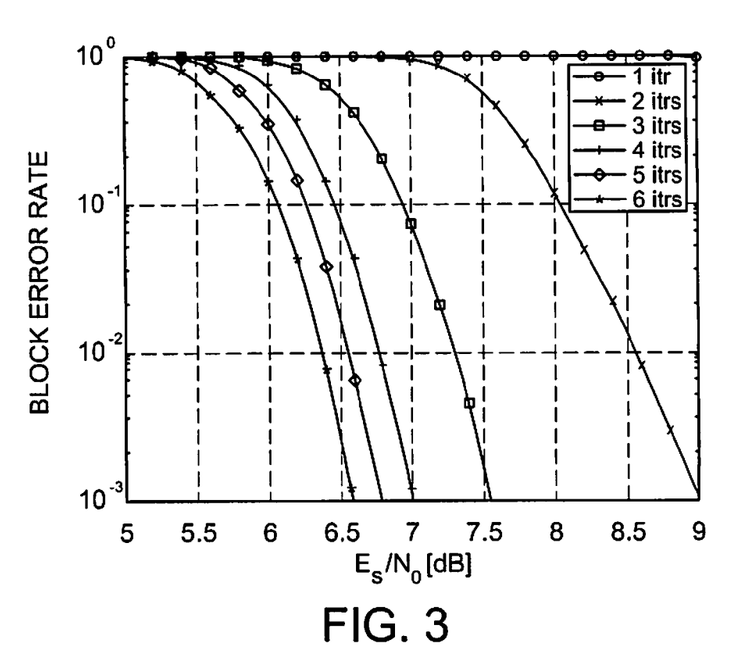
FIG. 3 illustrates the block error rate of a receiver that performs iterative demodulation and decoding using a rate one-half, 4-state code and eight PSK modulation.

FIG. 3 illustrates the performance of the decoder 56 shown in FIG. 2 using a rate one-half, 4-state convolutional code and eight PSK modulation. The graph illustrates the block error rate as a function of the bit energy-to-noise ratio for 1 to 8 iterations. As shown in FIG. 3, the block error rate decreases with the number of iterations due to the feedback of extrinsic information from the decoder 56 to the demodulator 52.

Figure 4:
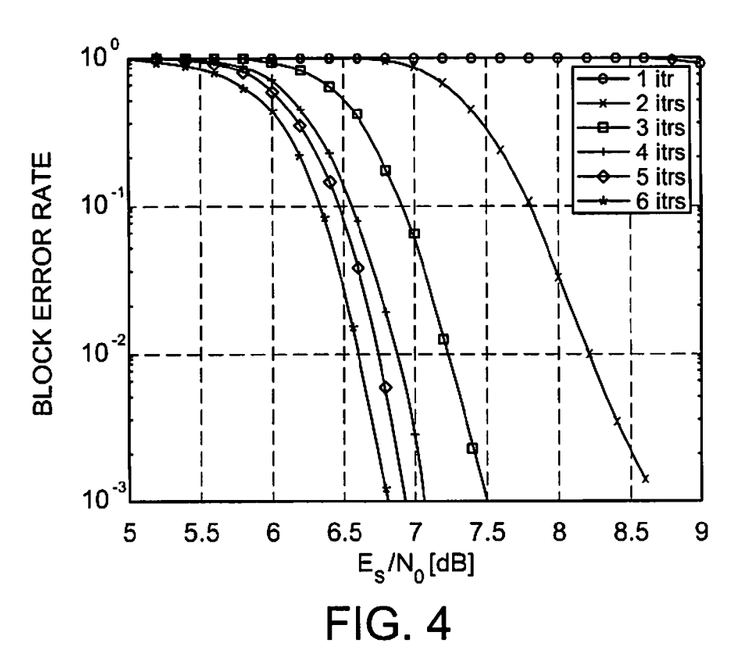
FIG. 4 illustrates the block error rate of the receiver that performs iterative demodulation and decoding using a rate one-half, 8-state code with eight PSK modulation.

FIG. 4 illustrates the performance of the decoder 56 shown in FIG. 2 using a rate one-half, 8-state convolutional code with eight PSK modulation. The only difference between the decoders 56 considered in FIGS. 3 and 4 is the increase in the number of states for the convolutional code. Because the decoder 56 considered in FIG. 4 uses a code with greater error correction capability, it would be expected to perform better than the decoder 56 considered in FIG. 3. Indeed, after the first iteration, the 8-state decoder 56 considered in FIG. 4 produces a lower block error rate than the 4-state decoder 56 considered in FIG. 3. However, after eight iterations, the performance of the 4-state decoder 56 is better than the performance of the 8-state decoder 56. The relatively poor performance of the 8-state decoder 56 compared to the 4-state decoder 56 is due to an imbalance between the decoder 56 and demodulator 52. The strong decisions by the 8-state decoder 56 tend to overwhelm the demodulator 52 causing the demodulator 52 to simply confirm decisions already made by the decoder 56.

Figure 5:
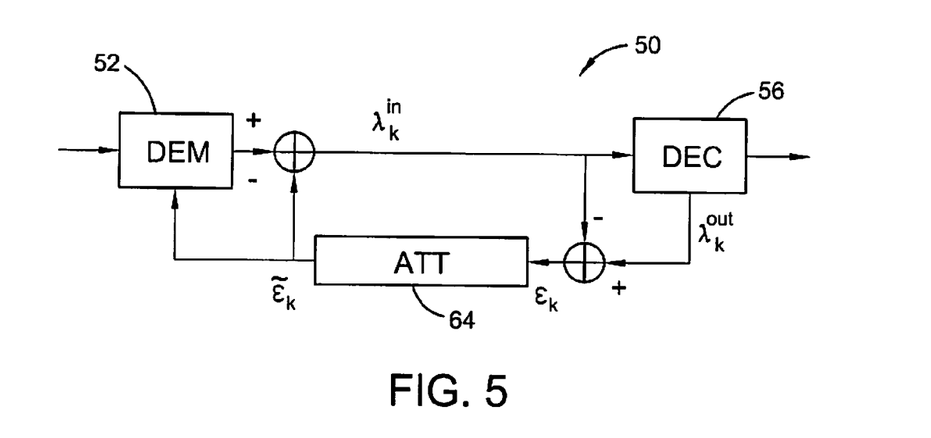
FIG. 5 illustrates an exemplary receiver using iterative demodulation and decoding according to one embodiment of the invention with an attenuator in the feedback path.
Figure 6:
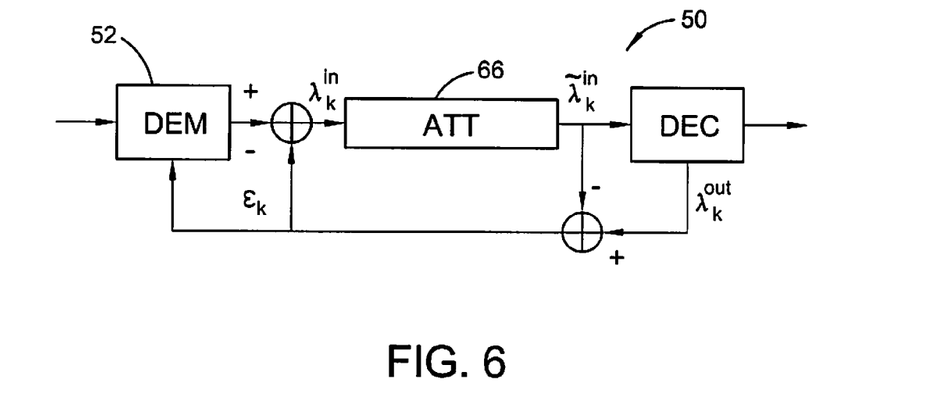
FIG. 6 illustrates an exemplary receiver using iterative demodulation and decoding according to one embodiment of the invention with an attenuator in the feed-forward path.
Figure 7:
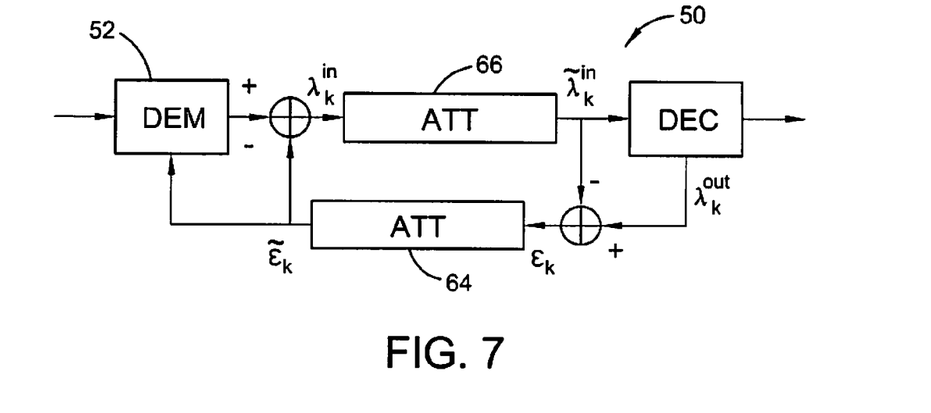
FIG. 7 illustrates an exemplary receiver using iterative demodulation and decoding according to one embodiment of the invention with an attenuator in both the feedback path and the feed-forward path.

FIGS. 5-7 illustrate various receiver architectures, including an attenuation mechanism to attenuate the influence of the extrinsic information $\epsilon_k$ fed back from the decoder 56 to the demodulator 52. For convenience, the deinterleaver 54 and interleaver 58 shown in FIG. 2 are omitted but should be understood to be present.

In FIG. 5, an attenuator 64 is placed on the feedback path from the decoder 56 to the demodulator 52. The attenuator 64 is designed to reduce the strength and/or number of extrinsic values $\epsilon_k$ fed back to the demodulator 52. As described in greater detail below, the attenuator 64 can take the form of a regular effective puncturer, a non-regular effective puncturer, a variable gain linear limiter, a variable gain non-linear limiter, a variable gain multiplier, a linear/multiplier with regular period, and a linear/multiplier with pseudo-random.

In the embodiment shown in FIG. 6, an attenuator 66 is placed in the feed forward path from the demodulator 52 to the decoder 56. In this embodiment, the attenuator 66 changes the strength and/or number of input soft values $\tilde{\lambda}_k^{in}$ fed to the decoder 52. By regulating the input soft values $\tilde{\lambda}_k^{in}$ fed to the decoder 56, the decisions made by the decoder 56 will not be as strong, and the extrinsic values $\epsilon_k$ fed back to the demodulator 52 will therefore have less influence on the demodulator 52. Thus, the attenuator 66 in this embodiment indirectly controls the influence of the extrinsic values $\epsilon_k$ by regulating or controlling the input soft values $\tilde{\lambda}_k^{in}$ to the decoder 56.

In the embodiment shown in FIG. 7, a first attenuator 64 is placed in the feedback path from the decoder 56 to the demodulator 52, and a second attenuator 66 is placed in the feed forward path from the demodulator 52 to the decoder 56. The first attenuator 64 regulates the extrinsic values $\epsilon_k$ fed back from the decoder 56 to the demodulator 52, while the second attenuator 66 regulates or controls the input soft values $\tilde{\lambda}_k^{in}$ fed from the demodulator 52 to the decoder 56.

Figure 8:
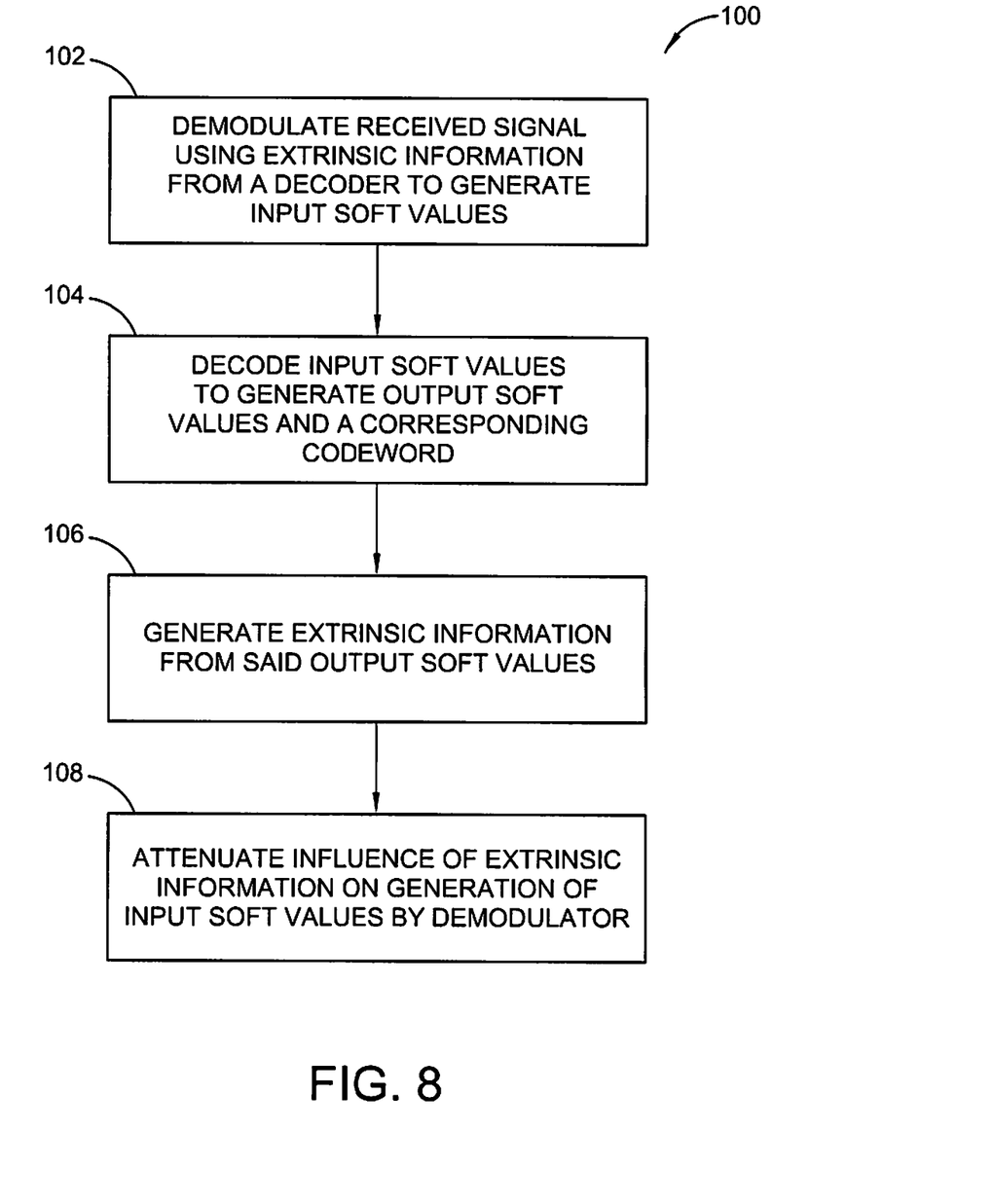
FIG. 8 illustrates an exemplary method for iteratively demodulating and decoding a received signal using feedback attenuation.

FIG. 8 illustrates an exemplary method of iterative decoding and modulation with feedback attenuation. The method shown in FIG. 8 can be used with any of the receiver architectures shown in FIGS. 5-7. The demodulator iteratively demodulates a received signal using extrinsic information from a decoder to generate input soft values (block 102). The decoder 56 decodes the input soft values to generate output soft values and makes a hard decision to produce an estimate of the information sequence (block 104). Extrinsic information for feedback to the demodulator is generated by subtracting the input soft values from the output soft values (block 106). The influence of the extrinsic information on the generation of soft values by the demodulator is attenuated using one or more attenuation methods as hereinafter described (block 108).

In one exemplary embodiment of the invention, the attenuator 64 in the feedback path as shown in FIGS. 5 and 6 uses a technique referred to herein as effective puncturing to reduce the number of extrinsic values $\epsilon_k$ fed back from the decoder 56 to the demodulator 52. The effective puncturing can be implemented by means of a puncture table stored in memory of the receiver 50. For each iteration, the puncture table stores N puncture values $t_k^{[i]}$, that correspond one-to-one with the N extrinsic values $\epsilon_k$ fed back from the decoder 56. A puncture value equal to zero and the $k^{th}$ position indicates that the corresponding extrinsic value $\epsilon_k$ is punctured. The puncturing of the extrinsic values $\epsilon_k$ is given by:

$$\hat{\epsilon}_k = t_k^{(i)} \epsilon_k \qquad \text{Eq. 1}$$

It may be noted that, for each punctured location, the extrinsic value $\epsilon_k$ fed back to the demodulator 52 equals zero and that the corresponding input soft value $\tilde{\lambda}_k^{in}$ fed to the decoder 56 in the next iteration equals the bit soft value $\lambda_k$ output by the demodulator 52. The effect of puncturing is to restrict the flow of information from the decoder 56 to the demodulator 52 and, thus, reduce the influence of the extrinsic values $\epsilon_k$ on the decisions of the demodulator 52.

The number of bits punctured by the attenuator 64 may be dependent on the number of iterations performed. The puncture table may store multiple puncture patterns that are selected for use based on the number of iterations performed. In one embodiment, the number of extrinsic values punctured decreases as the number of iterations increases so that more information is fed back to the demodulator 52 as the number of iterations increases. In one embodiment, the attenuator 64 may be configured to feed back all extrinsic values $\epsilon_k$ that were fed back in the immediately-preceding iteration. This property is referred to as the rate compatible property. The rate compatible property ensures a consistent puncturing, where each extrinsic values $\epsilon_k$ fed back in previous iterations are maintained and more extrinsic values $\epsilon_k$ are fed back.

Effective puncturing may also be applied by the attenuator 66 in FIGS. 6 and 7. In this case, puncturing is applied to the input soft values $\tilde{\lambda}_k^{in}$ fed into the decoder 56. Puncturing in this case is given by:

$$\tilde{\lambda}_k^{in} = t_k^{(i)} \lambda_k^{in} \qquad \text{Eq. 2}$$

The extrinsic values $\epsilon_k$ fed back to the demodulator 52 are given by:

$$\epsilon_k = \lambda_k^{out} - \tilde{\lambda}_k^{in} \qquad \text{Eq. 3}$$

Thus, for each punctured location, the extrinsic value $\epsilon_k$ fed back to the demodulator 52 equals the output soft value $\lambda_k^{out}$ from the decoder 56. The effect of puncturing of the input soft values $\tilde{\lambda}_k^{in}$ is to restrict information fed into the decoder 56, making it act as if the code rate was higher. Suppose there are i iterations and let $N^{(i)}$ denote the number of input soft values reaching the decoder 56 at each iteration i. The effective coding rate seen by the decoder 56 at iteration i is $R^{(i)} = K/N^{(i)}$. Thus, for $N^{(i)} \leq N^{(2)} \leq \ldots \leq N^{(L)}$ the code rate will be $R^{(1)} \geq R^{(2)} \geq \ldots \geq R^{(L)}$.

In the embodiment shown in FIG. 7, effective puncturing can be used by the attenuator 64, 66 in both the feed back and feed forward paths. In this embodiment, the attenuator 64 punctures the extrinsic values $\epsilon_k$ fed back to the demodulator 52, while the attenuator 66 punctures the input soft values $\tilde{\lambda}_k^{in}$ fed into the decoder 56. In one embodiment of the invention, the same puncturing tables may be used by both attenuators 64, 66 for puncturing the extrinsic values $\epsilon_k$ and input soft values $\tilde{\lambda}_k^{in}$, respectively. Alternatively, different puncturing tables may be used.

With a single puncturing table, it is possible that the decoder 56 ends up converging on an incorrect solution. To mitigate this problem, multiple puncturing tables corresponding to different puncturing patterns can be used. In a serial decoding approach, the receiver 50 attempts to decode the received signal r using a first puncturing table. If the CRC fails, the receiver 50 repeats the decoding process using a different puncturing table and continues until the CRC is successful.

Figure 9:
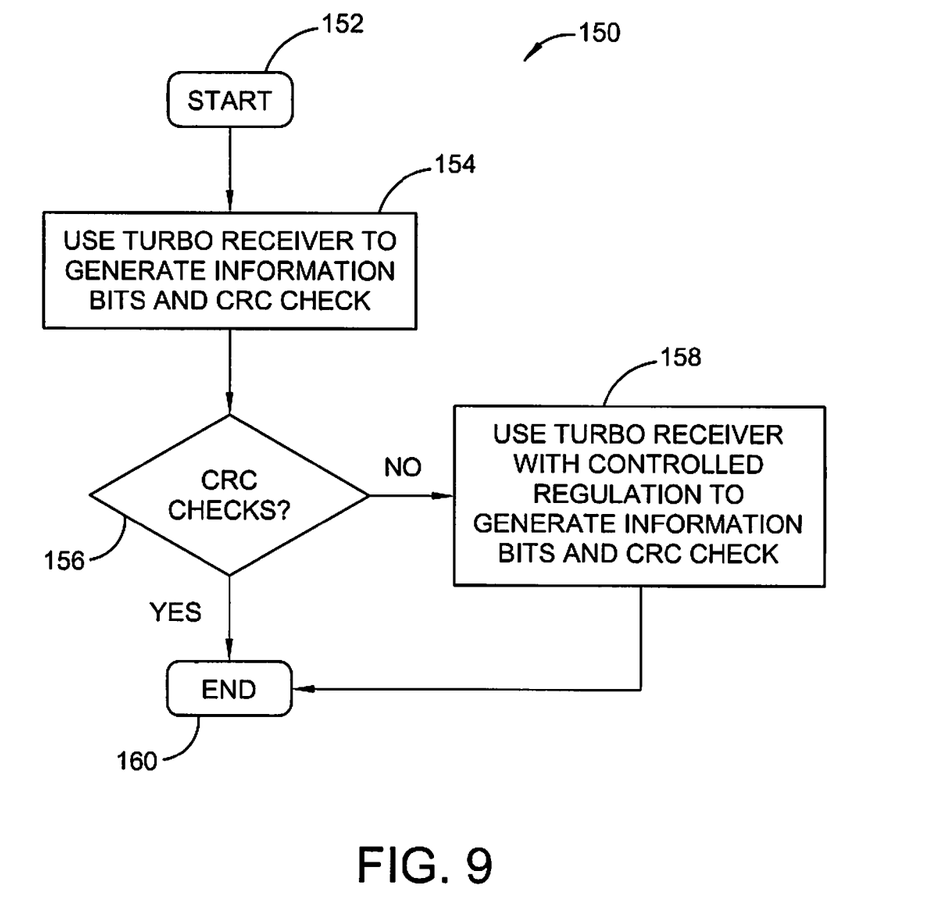
FIG. 9 illustrates another exemplary method of iterative demodulation and decoding where feedback attenuation is selectively employed in the event of decoding failure.

FIG. 9 illustrates an exemplary method 150 for iteratively demodulating and decoding a received signal according to one embodiment. When the decoding process begins (block 152), the receiver 50 uses conventional iterative demodulation and decoding to generate an estimate of the transmitted information sequence (block 154) and performs a CRC check (block 156). If the CRC is valid, the process ends (block 110). If the CRC check fails, the receiver 50 continues the demodulation and decoding with feedback attenuation of the extrinsic information as previously described (block 158) As previously noted, attenuation of the extrinsic information can be effected by regulating the extrinsic values $\epsilon_k$ fed back to the demodulator 52, the input soft values $\tilde{\lambda}_k^{in}$ fed to the decoder 56, or both. The iterative demodulating and decoding continues until a valid CRC is produced, or until a predetermined number of iterations have been performed, after which the process ends (block 160).

Figure 10:
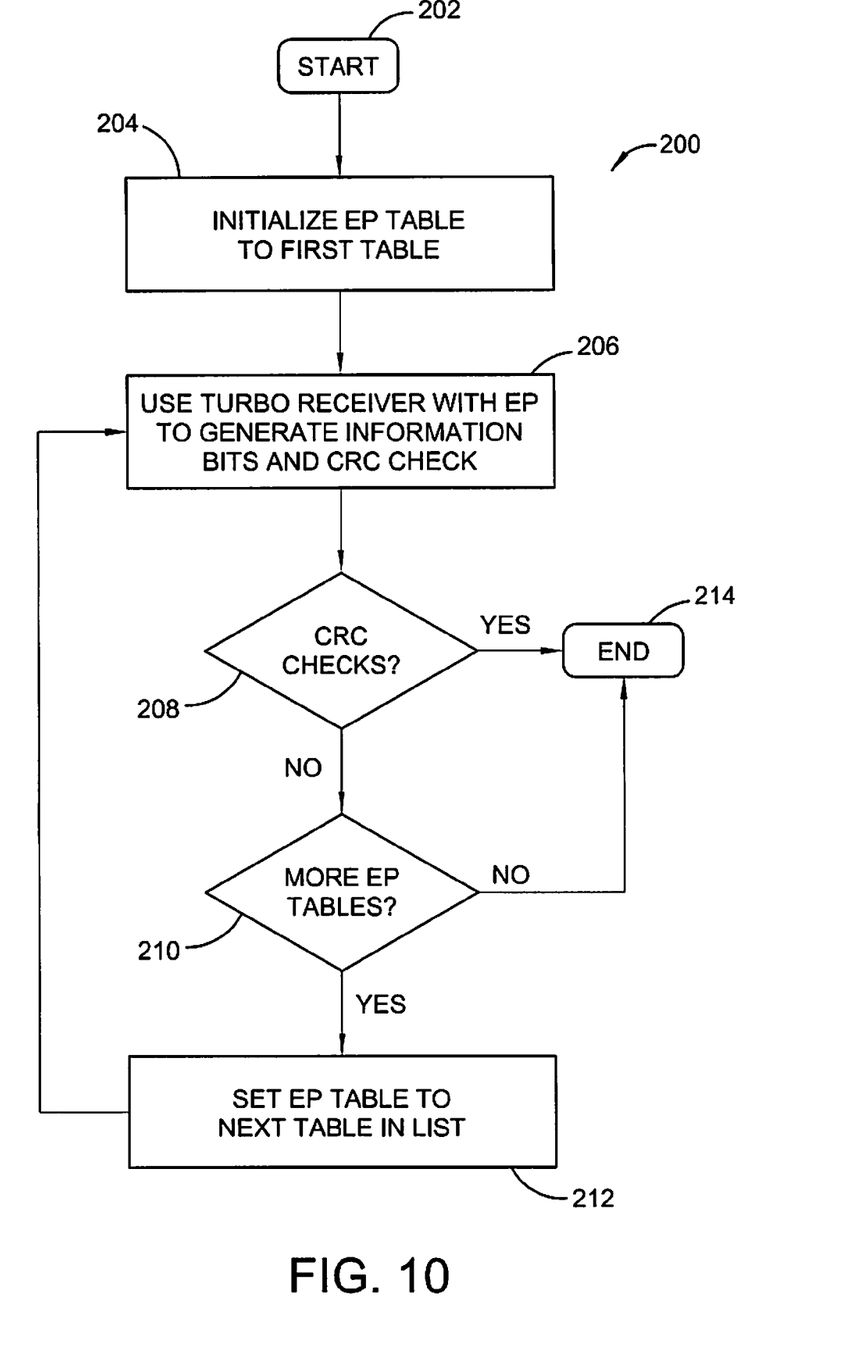
FIG. 10 illustrates an exemplary method of iterative demodulation and decoding using different puncturing tables.

FIG. 10 illustrates an exemplary decoding method 200 using multiple puncturing tables in a serial approach. When the decoding process begins (block 202), the receiver 50 selects a first puncturing table (block 204). The receiver 50 demodulates and decodes the received signal using the first puncturing table (block 206). Demodulation and decoding may continue for a predetermined number of iterations. The receiver 50 may check the CRC after each iteration (block 208) and stop the decoding process if the CRC is valid (block 214). If the CRC fails after the final iteration, the receiver 50 determines whether there are any more untried puncturing tables (block 210). If so, the receiver 50 selects the next table (block 212) and repeats the decoding process. The decoding process ends without success if the CRC check fails after the final iteration with the final puncturing table (block 214).

When multiple puncturing tables are used, it is possible that different puncturing tables will result in different valid codewords. In this case, only one of the valid codewords is the correct solution. To determine which valid codeword to keep, some form of arbitration may be needed. For example, a maximum likelihood (ML) metric can be used to evaluate each valid codeword. The ML metric could be obtained by re-encoding, re-modulating, and channel filtering the codewords output by the decoder 56 to regenerate the received signal. The regenerated signals could then be compared to the actual received signal to form an ML metric. The generation of ML metrics by re-generation of the received signal is known in the art and is therefore described briefly herein. If the noise is assumed to be white, the magnitude square of the difference between the re-generated and actual received signals could be used. Spatial and/or temporal noise correlation estimates could be included in the metric.

Figure 11:
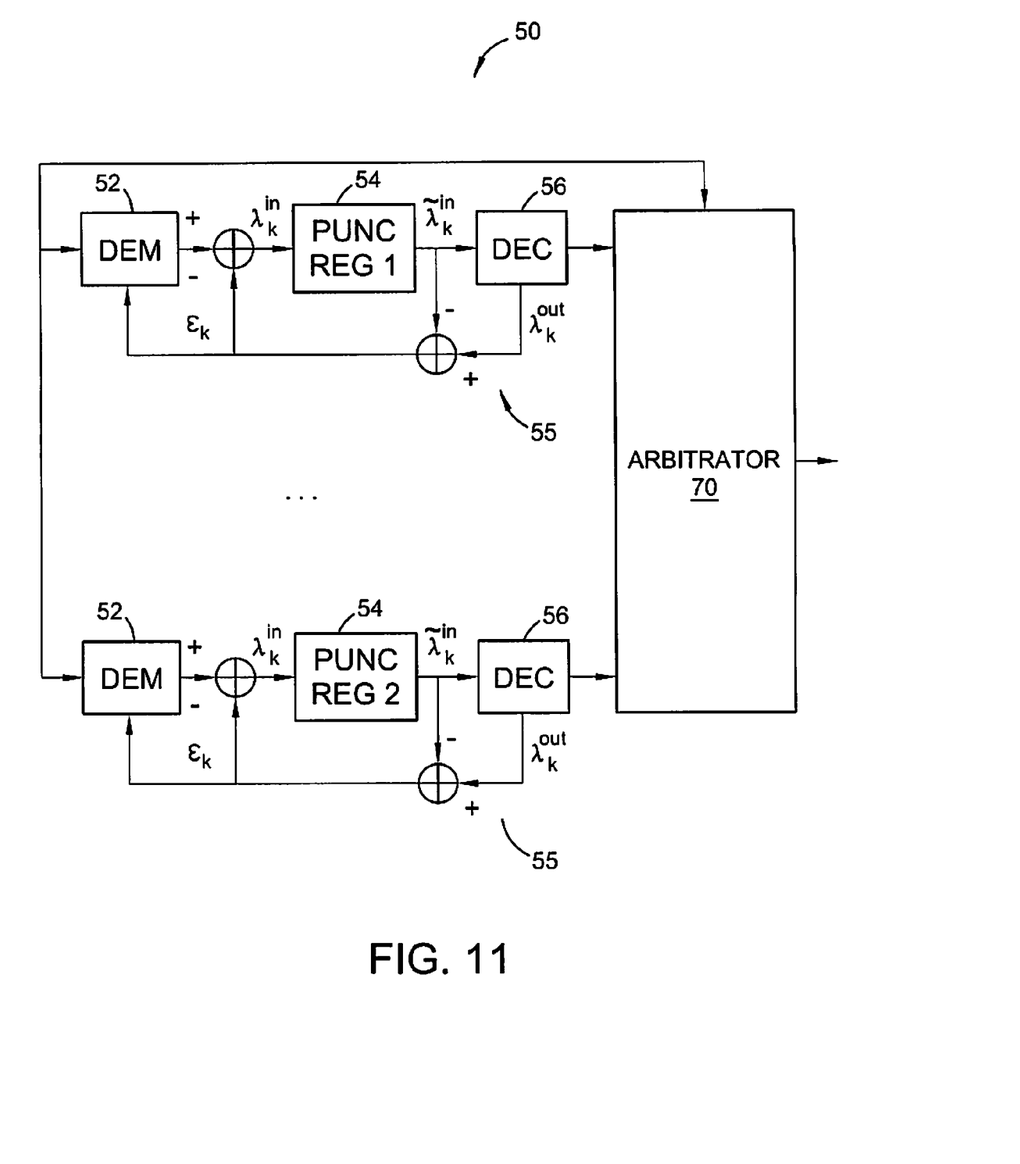
FIG. 11 illustrates a parallel iterative decoder according to one embodiment.

FIG. 11 illustrates a receiver 50 with parallel receiver chains 55. Each receiver chain 55 includes a demodulator 52 and decoder 56 as previously described. For simplicity, the deinterleavers/interleavers are omitted but should be understood to be present. In this exemplary embodiment, an attenuator 66 is disposed in the feed forward path for each receiver chain 55. Each one of the attenuators 66 employs effective puncturing as previously described using a different puncturing table. The output of each receiver chain 55 is fed to an arbitrator 70. In the event that two or more valid codewords are generated, the arbitrator 70 determines which of the valid codeword is most likely to be the correct solution based on an ML metric.

Arbitration can also be used to reduce complexity. For example, suppose there are four receiver chains 55 using four different puncturing tables. For convenience, the receiver chains are referred to herein as chains 1-4. Assume that receiver chain 1 generates a valid codeword after the first iteration. Of the remaining three, the ML arbitration metric could be used to select which ones of the remaining receiver chains 55 to use for subsequent iterations. For example, the arbitrator 70 may select the receiver chains that produce the highest ML metric for subsequent iterations. Alternatively, the arbitrator 70 could compare the ML metric for each receiver chain and select those that meet a predetermined threshold.

Figure 12:
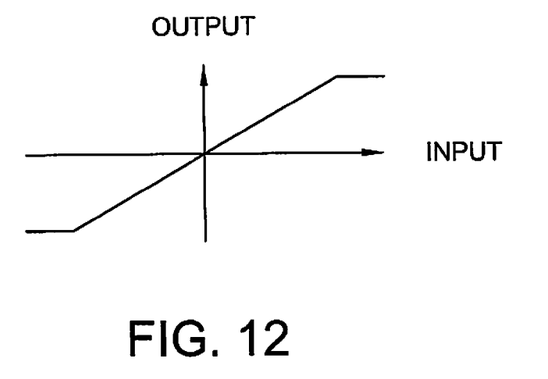
FIG. 12 illustrates the output of a linear limiter used as a feedback attenuator input according to one exemplary embodiment.
Figure 13:
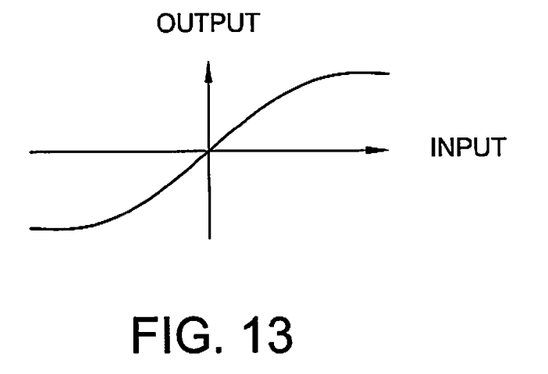
FIG. 13 illustrates the output of a non-linear limiter used as a feedback attenuator according to one exemplary embodiment.

In another embodiment of the invention, the attenuator 64 shown in FIGS. 5 and 6 or attenuator 66 shown in FIGS. 6 and 7 can be implemented as a variable gain limiter or variable gain multiplier. As one non-limiting example, the attenuator 66 in the feed-forward path may comprise a linear limiter as shown in FIG. 12 with controllable gain and limit level. The output value for the attenuator 66 may be computed according to:

$$\lambda^{out} = \begin{cases} C^{itr}, & \text{if } g^{itr} \cdot x^{itr} > C^{itr} \\ -C^{itr}, & \text{if } g^{itr} \cdot x^{itr} < C^{itr} \\ g^{itr} \cdot x^{itr}, & \text{otherwise} \end{cases} \qquad \text{Eq. 4}$$

where $g^{itr}$ is the gain factor and $C^{itr}$ is the maximum output magnitude to be applied for iteration itr. The gain or limit levels of the limiter may be varied depending on the number of iterations performed. That is, the gain and/or limit levels can be increased with each iteration, or at predetermined iterations. The variable gain limiter may also comprise a non-linear limiter as shown in FIG. 13. Those skilled in the art will recognize that the variable gain linear or non-linear limiter can be also be used in the feedback path between the decoder 56 and demodulator 52 as an attenuator 64 to prevent strong feed backs from the decoder 56 in early iterations.

Figure 14:
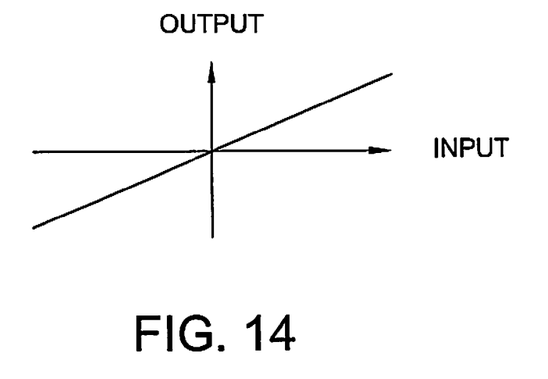
FIG. 14 illustrates the output of a linear multiplier used as a feedback attenuator according to one embodiment.

In one embodiment of the invention, computational complexity can be reduced by using a variable gain multiplier as an attenuator 64, 66. As one non-limiting example, the output from the attenuator 66 in the feed-forward path for iteration itr may be computed according to:

$$\lambda^{out} = \frac{itr}{I_{max}} x^{in} \qquad \text{Eq. 5}$$

where $I_{max}$ is the maximum number of iterations for the receiver 50. The multiplier gradually allows the full strength of the decoder 56 feedback to pass through to the demodulator 52. FIG. 14 illustrates the output of an exemplary variable gain multiplier as a function of the input.

The variable gain limiters and multipliers can be applied selectively to the extrinsic values $\epsilon_k$ fed back to the demodulator 52. More particularly, the attenuator 64, 66 may use a control table similar to the puncturing table that contains N control values. A control value equal to 0 indicates that the limiter and/or multiplier is not applied, while a control value equal to 1 indicates that the limiter and/or multiplier is applied. To reduce complexity, the receiver 50 may compute a control vector comprising N control values based on a formula, rather than a table. In one embodiment of the invention, the control vector may be defined by a pseudo-random number generating function.

Figure 15:
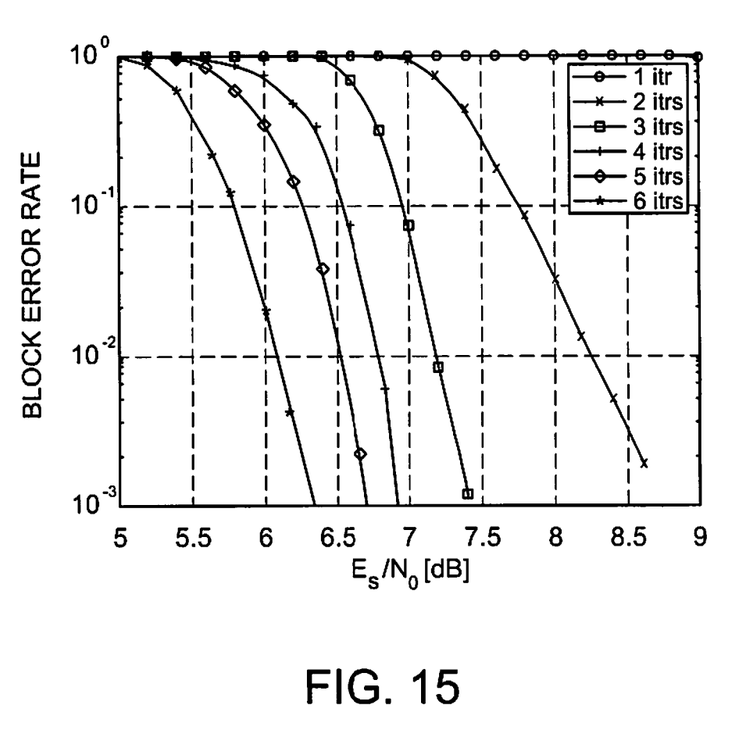
FIG. 15 illustrates the block error rate of the receiver according to one embodiment as a function of the bit energy-to-noise ratio for 1-8 iterations using a rate one-half code with an 8-state code.

The present invention enables improved performance of an iterative decoder and demodulator by maintaining a proper balance between the demodulator 52 and decoder 56. FIG. 15 illustrates the block error rate as a function of the bit energy-to-noise ratio for 1-8 iteration using a rate one-half code with an 8-state convolutional code. Comparing FIG. 15 to FIG. 4, which considers the identical receiver configuration, it can be seen that the feedback attenuation allows the receiver to continue to make progress after the first few iterations. Thus, more than 0.6 dB performance gain is obtained after eight iterations. Further, comparing FIG. 15 with FIG. 3, it can be seen that the feedback attenuation allows the receiver with stronger error correction code to outperform the one with the weaker error correction code.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A receiver for iteratively decoding a received signal, said receiver comprising:
    a demodulator for iteratively generating input soft values based on the received signal and extrinsic information;
    a decoder for iteratively decoding the input soft values from the demodulator to generate output soft values and a corresponding codeword;
    a feedback path connecting an output of the decoder to an input of the demodulator to feed back said extrinsic information to said demodulator;
    a feed-forward path connecting an output of the demodulator to an input of the decoder to feed forward said input soft values to the decoder; and
    an attenuator in at least one of the feed-forward path and the feedback path to attenuate, based on a number of iterations performed by the demodulator and the decoder, the influence of the extrinsic information on the generation of the input soft values by the demodulator.

2. The receiver of claim 1 wherein the extrinsic information comprises a set of extrinsic values representing the difference between said input soft values and respective ones of the output soft values.

3. The receiver of claim 2 wherein the attenuator is disposed in the feedback path for attenuating the extrinsic values fed back to the demodulator.

4. The receiver of claim 3 wherein the attenuator comprises a puncturer configured to puncture the extrinsic values fed back from the decoder to the demodulator based on the number of iterations performed.

5. The receiver of claim 3 wherein the attenuator comprises a variable gain limiter for limiting the extrinsic values fed back from the decoder to the demodulator based on the number of iterations performed.

6. The receiver of claim 5 wherein at least one of the limit levels and the gain of the variable gain limiter is varied based on the number of iterations performed.

7. The receiver of claim 3 wherein the attenuator comprises a variable gain multiplier for varying the gain of the extrinsic values fed back from the decoder to the demodulator based on the number of iterations performed.

8. The receiver of claim 3 wherein a second attenuator is disposed in the feed-forward path to attenuate the input soft values fed from the demodulator to the decoder.

9. The receiver of claim 8 wherein the second attenuator comprises a puncturer configured to puncture the input soft values fed back from the demodulator to the decoder based on the number of iterations performed.

10. The receiver of claim 8 wherein the second attenuator comprises a variable gain limiter for limiting the input soft values fed from the demodulator to the decoder based on the number of iterations performed.

11. The receiver of claim 10 wherein at least one of the limit levels and the gain of the variable gain limiter is varied based on the number of iterations performed.

12. The receiver of claim 8 wherein the second attenuator comprises a variable gain multiplier for varying the gain of the input soft values fed from the demodulator to the decoder based on the number of iterations performed.

13. The receiver of claim 1 wherein the attenuator is disposed in the feed-forward path to attenuate the input soft values fed from the demodulator to the decoder.

14. The receiver of claim 13 wherein the attenuator comprises a puncturer configured to puncture the input soft values fed from the demodulator to the decoder based on the number of iterations performed.

15. The receiver of claim 13 wherein the attenuator comprises a variable gain limiter for limiting the input soft values fed back from the demodulator to the decoder based on the number of iterations performed.

16. The receiver of claim 15 wherein at least one of the limit levels and the gain of the variable gain limiter is varied based on the number of iterations performed.

17. The receiver of claim 13 wherein the attenuator comprises a variable gain multiplier for varying the gain of the input soft values fed from the demodulator to the decoder based on the number of iterations performed.

18. The receiver of claim 1 wherein the extrinsic information comprises a set of extrinsic values representing the difference between said input soft values and respective ones of the output soft values and wherein the attenuator is disposed in the feedback path and is configured to generate multiple versions of the extrinsic values.

19. The receiver of claim 18 wherein the demodulator is configured to generate multiple sets of input soft values from different versions of the extrinsic values; and wherein the decoder is configured to decode said multiple sets of input soft values to generate multiple sets of output soft values.

20. The receiver of claim 18 comprising two or more parallel demodulators generating sets of input soft values from different versions of said extrinsic values, and two or more parallel decoders for decoding said input soft values from respective demodulators.

21. The receiver of claim 20 further comprising an arbitrator to select between two or more valid codewords produced by said two or more parallel decoders.

22. The receiver of claim 1 wherein the attenuator is disposed in the feed-forward path and is configured to generate multiple sets of the input soft values.

23. The receiver of claim 22 wherein the decoder is configured to decode said multiple sets of input soft values to generate multiple sets of output soft values.

24. The receiver of claim 22 comprising two or more parallel decoders for decoding said multiple sets of input soft values from said attenuator.

25. The receiver of claim 24 further comprising an arbitrator to select between two or more valid codewords produced by said two or more parallel decoders.

26. The receiver of claim 1 further comprising control logic to stop the iterative decoding of the received signal responsive to a determination that an output codeword is valid.

27. A method for iteratively decoding a received signal, said method comprising:
    iteratively demodulating the received signal in a demodulator using extrinsic information fed back from a decoder, to generate input soft values;

iteratively decoding by the decoder the input soft values from the demodulator, to generate output soft values and a corresponding codeword;

generating extrinsic information from the output soft values generated by the decoder; and attenuating, based on a number of iterations performed by the demodulator and the decoder, the influence of the extrinsic information on the generation of the input soft values by the demodulator.

28. The method of claim 27 wherein generating extrinsic information from the output soft values generated by the decoder comprises generating a set of extrinsic values representing the difference between said input soft values and respective ones of the output soft values.

29. The method of claim 28 wherein attenuating, based on the number of iterations performed, the influence of the extrinsic information on the generation of the input soft values by the demodulator comprises attenuating the extrinsic values fed back to the demodulator.

30. The method of claim 29 wherein attenuating the extrinsic values fed back to the demodulator comprises puncturing the extrinsic values fed back from the decoder to the demodulator based on the number of iterations performed.

31. The method of claim 29 wherein attenuating the extrinsic values fed back to the demodulator comprises limiting, in a variable gain limiter, the extrinsic values fed back from the decoder to the demodulator based on the number of iterations performed.

32. The method of claim 31 further comprising varying at least one of the limit levels and the gain of the variable gain limiter based on the number of iterations performed.

33. The method of claim 29 wherein attenuating the extrinsic values fed back to the demodulator comprises varying, in a variable gain multiplier, the gain of the extrinsic values fed back from the decoder to the demodulator based on the number of iterations performed.

34. The method of claim 29 further comprising attenuating the input soft values fed from the demodulator to the decoder.

35. The method of claim 34 wherein attenuating the input soft values fed from the demodulator to the decoder comprises puncturing the input soft values fed from the demodulator to the decoder based on the number of iterations performed.

36. The method of claim 34 wherein attenuating the input soft values fed from the demodulator to the decoder comprises limiting, in a variable gain limiter, the input soft values fed from the demodulator to the decoder based on the number of iterations performed.

37. The method of claim 36 further comprising varying at least one of the limit levels and the gain of the variable gain limiter based on the number of iterations performed.

38. The method of claim 34 wherein attenuating the input soft values fed from the demodulator to the decoder comprises varying, in a variable gain multiplier, the gain of the input soft values fed from the demodulator to the decoder based on the number of iterations performed.

39. The method of claim 27 wherein attenuating, based on the number of iterations performed, the influence of the extrinsic information on the generation of the input soft values by the demodulator comprises attenuating the input soft values fed from the demodulator to the decoder.

40. The method of claim 39 wherein attenuating the input soft values fed from the demodulator to the decoder comprises puncturing the input soft values fed from the demodulator to the decoder based on the number of iterations performed.

41. The method of claim 39 wherein attenuating the input soft values fed from the demodulator to the decoder comprises limiting, in a variable gain limiter, the input soft values fed from the demodulator to the decoder, based on the number of iterations performed.

42. The method of claim 41 further comprising varying at least one of the limit levels and the gain of the variable gain limiter based on the number of iterations performed.

43. The method of claim 39 wherein attenuating the input soft values fed from the demodulator to the decoder comprises varying, in a variable gain multiplier, the gain of the input soft values fed from the demodulator to the decoder based on the number of iterations performed.

44. The method of claim 27 comprising generating multiple versions of the extrinsic values.

45. The method of claim 44 comprising generating multiple sets of input soft values from different versions of the extrinsic values; and decoding said multiple sets of input soft values to generate multiple sets of output soft values.

46. The method of claim 44 comprising generating multiple sets of input soft values, from two or more parallel demodulators, based on different versions of said extrinsic values, and decoding said input soft values from respective demodulators in two or more parallel decoders.

47. The method of claim 46 further comprising selecting between two or more valid codewords produced by the two or more parallel decoders.

48. The method of claim 27 comprising generating multiple sets of the input soft values.

49. The method of claim 48 comprising decoding said multiple sets of input soft values to generate multiple sets of output soft values.

50. The method of claim 48 comprising decoding said multiple sets of input soft values in two or more parallel decoders.

51. The method of claim 50 further comprising selecting between two or more valid codewords produced by the two or more parallel decoders.

52. The method of claim 27 further comprising stopping the iterative decoding of the received signal responsive to a determination that an output codeword is valid.

* * * * *

UNITED STATES PATENT AND TRADEMARK OFFICE
CERTIFICATE OF CORRECTION

PATENT NO. : 8,451,952 B2  
APPLICATION NO. : 12/650219  
DATED : May 28, 2013  
INVENTOR(S) : Khayrallah et al.

Page 1 of 1

It is certified that error appears in the above-identified patent and that said Letters Patent is hereby corrected as shown below:

On the Title Page, in Item (56), under "OTHER PUBLICATIONS", in Column 2, Line 4, delete "XPOO1512695," and insert -- XP001512695, --, therefor.

On the Title Page, in Item (56), under "OTHER PUBLICATIONS", in Column 2, Line 9, delete "XPOII189323," and insert -- XP011189323, --, therefor.

On the Title Page, in Item (56), under "OTHER PUBLICATIONS", in Column 2, Line 12, delete "Internat" and insert -- Internet --, therefor.

In the Specification

In Column 4, Line 20, delete "ratio (UR)" and insert -- ratio (LLR) --, therefor.

In Column 4, Line 26, delete "decoder 52" and insert -- decoder 56 --, therefor.

In Column 5, Line 30, delete "decoder 52." and insert -- decoder 56. --, therefor.

In the Claims

In Column 9, Line 64, in Claim 9, delete "fed back" and insert -- fed --, therefor.

In Column 10, Line 20, in Claim 15, delete "fed back" and insert -- fed --, therefor.

Signed and Sealed this  
Eighth Day of October, 2013

Teresa Stanek Rea  
*Deputy Director of the United States Patent and Trademark Office*